United States Patent [19]
Mih et al.

[11] Patent Number: 6,132,940
[45] Date of Patent: Oct. 17, 2000

[54] METHOD FOR PRODUCING CONSTANT PROFILE SIDEWALLS

[75] Inventors: Rebecca D. Mih; Franz X. Zach, both of Wappingers Falls, N.Y.

[73] Assignee: International Business Machines Corporation, Armonk, N.Y.

[21] Appl. No.: 09/213,028

[22] Filed: Dec. 16, 1998

[51] Int. Cl.[7] ............................................ G03F 7/00
[52] U.S. Cl. ................................. 430/394; 430/312
[58] Field of Search ........................... 430/30, 312, 394

[56] References Cited

U.S. PATENT DOCUMENTS

| | | | |
|---|---|---|---|
| 4,474,864 | 10/1984 | Chow et al. | 430/30 |
| 4,891,094 | 1/1990 | Waldo, III | 150/626 |
| 4,971,895 | 11/1990 | Sullivan | 430/328 |
| 4,988,609 | 1/1991 | Hashimoto et al. | 430/326 |
| 5,304,441 | 4/1994 | Samuels et al. | 430/30 |
| 5,434,026 | 7/1995 | Takatsu et al. | 430/30 |
| 5,698,377 | 12/1997 | Seino | 430/325 |
| 5,905,019 | 5/1999 | Obszarny | 430/327 |

FOREIGN PATENT DOCUMENTS

0399837B1  5/1990  European Pat. Off. .

*Primary Examiner*—John A. McPherson
*Attorney, Agent, or Firm*—Tiffany L. Townsend

[57] ABSTRACT

A method of making at least one feature on an object having an upper surface, comprising the steps of:

1. applying a layer of a photoresist having an initial thickness to the upper surface;
2. exposing the layer of photoresist to a first dosage of light having a first intensity for a first predetermined period of time, such that at least a portion of the upper surface has a thickness that is at most equal to the initial thickness; and
3. exposing the layer of photoresist to a second dosage of light having a second intensity for a second predetermined period of time, such that at least a subset of the portion of the upper surface exposed by the first dosage of light is exposed by the second dosage of light.

14 Claims, 4 Drawing Sheets

METHOD FOR PRODUCING CONSTANT PROFILE SIDEWALLS

FIELD OF THE INVENTION

This invention is drawn to the formation of line and via structures. More particularly, this invention relates to the formation of line and via structures which have a reliable shape and more constant profile.

BACKGROUND OF THE INVENTION

In the semiconductor industry, it is often necessary to create features on a substrate or other medium. A line and via are examples of a feature. Features are sometimes said to be created positively or negatively. By positively it is meant that the shape of the feature is carved out of its surrounding medium and the material comprising the feature is deposited in the carved out area of the medium.

Photoresists, which are light sensitive, are one way to create feature shapes. There are different types of photoresists. The choice of photoresists rests with the user and the desired critical dimensions. If the features to be created are close together or have an aspect ratio greater than 1, then a high resolution positive photoresist may be preferable. For the purposes of this discussion, the duration of time that it takes to effectively pattern a feature to the specification of the operator will be referred to as one patterning cycle. Historically, there has been one interval of exposure to a predetermined light intensity, through a mask, followed by one interval of baking followed by one development interval during one patterning cycle. Each time a photoresist is patterned using a mask, it is possible that the resulting feature shape will not look exactly the same as during a previous patterning cycle. It is also possible that the sidewalls of the feature will not have a consistent slope and/or profile, meaning that the shape of the features may not be optimal.

There is one attribute which is generally, universally, desirable in a high resolution positive photoresist, a feature with sidewalls that are substantially perpendicular to the bottom of the feature. Additionally, it is desirable that there be a minimal amount of scumming and residual in the bottom of the feature. As the number of features on a substrate and the complexity of the features increases, methods have been developed to ensure that the user specified critical dimensions can be consistently and accurately measured. One critical dimension that can be measured, as shown in FIG. 1, is the profile of the sidewall of the patterned resist. The feature, 1, has a left sidewall, 2, and a right sidewall, 3. Each sidewall has at least one slope, s. The measurement of the profile can provide information as to the extent of exposure. The information can be fed back and the dosage adjusted to ensure that the predetermined shape of the feature is achieved. If the profile of the feature is not constant, then the information fed back for dosage adjustment may be incorrect.

BRIEF SUMMARY OF THE INVENTION

It is therefore an object of the present invention to provide a method of forming line and via structures with a constant profile.

It is another object of the present invention to provide a method which uses a swing curve to form via structures with a constant profile. These and other features, aspects, and advantages will be more readily apparent and better understood from the following detailed description of the invention, which describes a method of making at least one feature on an object having an upper surface, comprising the steps of:

a) applying a layer of a photoresist having an initial thickness to the upper surface;

b) exposing the layer of photoresist to a first dosage of light having a first intensity for a first predetermined period of time, such that at least a portion of the upper surface has a thickness that is at most equal to the initial thickness; and c) exposing the layer of photoresist to a second dosage of light having a second intensity for a second predetermined period of time, such that at least a subset of the portion of the upper surface exposed by the first dosage of light is exposed by the second dosage of light.

DETAILED EMBODIMENT

An attempt should be made to have the initial patterning of the photoresist closely resemble the final predetermined feature shape. When the initial patterning is precise there is less of a need to feed back information about the shape to correct dosage. However, even when the most precise initial patterning does not yield the exact desired feature dimensions, the amount of corrected necessary will, in most cases, be minimized. One method which can yield precise patterning results involves optical lithography.

Figure 1:
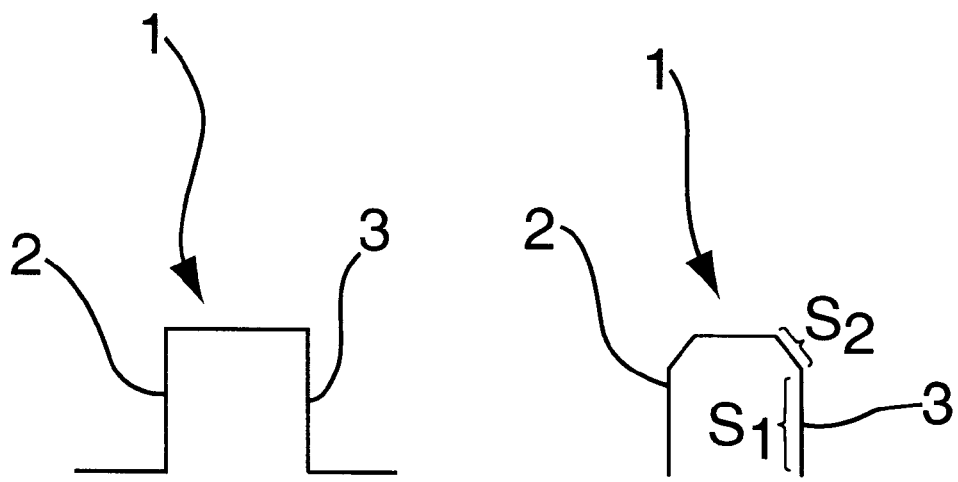
FIG. 1 is a cross-sectional view of a feature.
Figure 2:
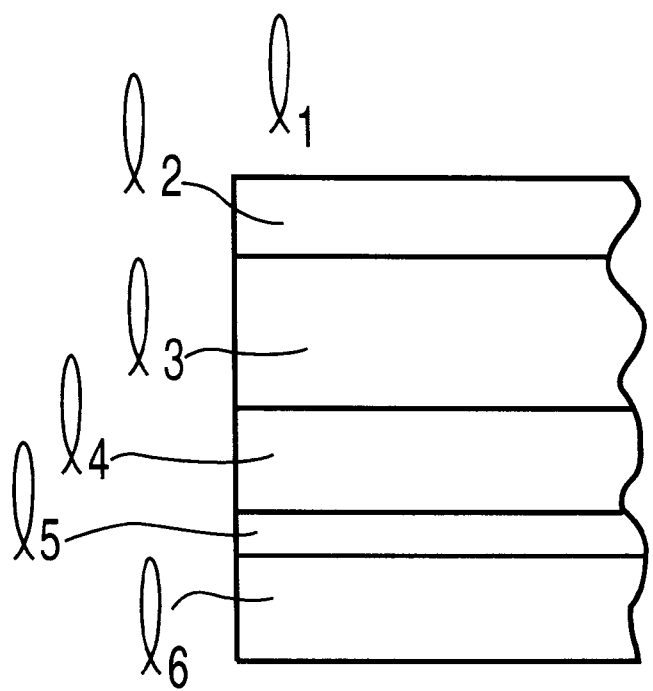
FIG. 2 is a cross-sectional view of the layers comprising the set of thin optically transmitting film.

Optical lithography focuses on the use of light and light intensity to pattern photoresists. When using optical lithography to print resist patterns for semiconductor processing, the substrate and resist may be considered a set of thin optically transmitting films. The light in the resist during exposure is governed by a thin film interference equation which references a structure as in FIG. 2. In FIG. 2, $l_1$ corresponds to layer 1, which in the instant example is air, $l_2$ corresponds to layer 2, which in the instant example is a resist layer, $l_3$ corresponds to layer 3, the layer directly below layer 2, which in the instant example is a substrate layer, $l_4$–$l_x$ (if present) correspond to the layers below $l_3$. It should be noted that the subject matter of the instant invention is not dependent on the composition of layers $l_3$–$l_x$.

As an example, for a set of three layers of optically transmitting film, a simplified optical lithographic equation governing the set of thin optically transmitting film is:

$$I(z)=I_o((e^{-\alpha z}+\rho_{23}^2 e^{-\alpha(2D-z)})-2\rho_{23}e^{(-\alpha D)}\cos(4\pi n_2(D-z)/\lambda))$$

where z=depth of the resist
D=the thickness of the resist
λ=the wavelength of light
α=the absorption coefficient of resist
$\rho_{23}$=effective reflection coefficient for the interface between layers 2 and 3, where $\rho_{23}=(n_2-n_3)/(n_2+n_3)$ $n_2$=refractive index of the second layer $n_3$=refractive index of the third layer $I_o$=the intensity incident on the top surface of the photoresist The thickness of layers $l_4$–$l_x$ have a fixed impact and do not vary the equation. For example, for the system shown in FIG. 2, the variables for the equation are actually a function of the resist, the interface between the layer below the resist and the resist and the wavelength of the light necessary to print the photoresist. The effective reflection coefficient for the interface between layers 2 and 3 remains a constant once layers 2 and 3 have been selected. Therefore, a plot of the light intensity (dose to print) vs. the thickness of the second layer, in this example a positive photoresist, can be determined and the minimum light intensity required to print a given thickness of positive photoresist identified. An example of a plot is shown as FIG. 3, for a positive photoresist which is has a low absorption at the exposure wavelength, that is having a small $\alpha$, absorption coefficient, at the exposure wavelength. The equation for the absorption coefficient is as follows: $\alpha=\ln(I/I_o)$ where I is the intensity of light transmitted through the resist of thickness (z), and $I_o$ is the intensity incident on the top surface of the photoresist. It is preferable that $\alpha<\ln(0.9)$. It should be noted that for the resist shown in FIG. 3, the length of time for each exposure is governed by a number of characteristics, including but not limited to, the type of photoresist, the thickness of the photoresist, the pre and post bake temperatures and times, the intensity of light and the temperature of the photoresist during exposure. Therefore, the length of time necessary when exposing will be determined by the operator.

Figure 3:
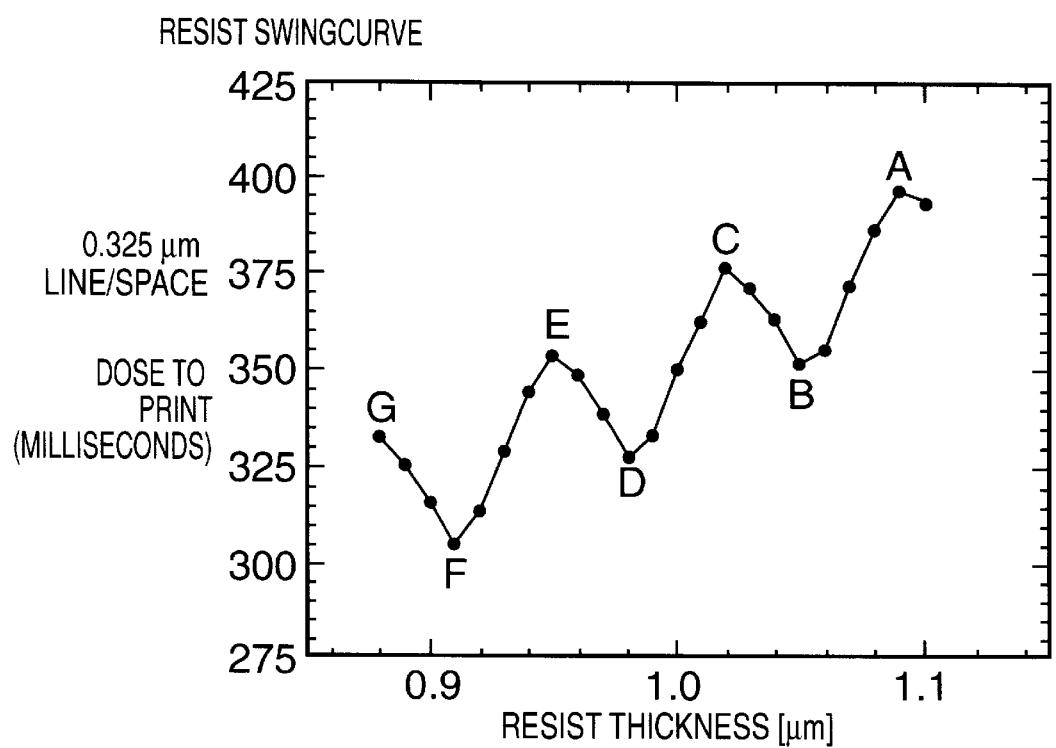
FIG. 3 is a representative plot of a photoresist's swing curve.

The plot shown as FIG. 3 gives the minimum dose necessary to print a given thickness of photoresist. Dose to print is a function of, at least, the intensity (dose) as expressed by the equation given supra, post-exposure bake temperature and time and the thickness of the photoresist. As can be seen from FIG. 3, the portion of the plot has one absolute maxima (A), 3 local maxima (C,E,G), 1 absolute minima (F) and 2 local minima (B,D). It should be noted that the absolute maxima (A) and minima (F) could become local if the plot for thickness was shifted. For the purposes of the instant invention the plot shown in FIG. 3 will be called a swing curve.

FIG. 3 can be used to determine the minimum light intensity needed to print an increasing thickness of photoresist where the relationship is not defined by a straight line with a positive slope. For example, it takes a lower minimum intensity to print a layer ≈0.98 $\mu$m thick than it does to print a layer ≈0.95 $\mu$m thick. This relationship, once realized, may be used to formulate a method of exposing the photoresist that creates more predictable features. The method would also maximize the operator's ability to effectively evaluate critical dimensions.

In order to employ the swing curve, a method must be described how to select the first dose, which determines the intermediate thickness. This intermediate thickness should preferably have a dose to print within 125% of chosen minimum on the swing curve. In order to select the intermediate thickness produced by the first exposure/develop cycle, detailed knowledge of the contrast of the individual photoresist must be experimentally determined and plotted as shown in FIG. 3. Each photoresist has its own characteristic curve as a function of dose, which may be similar to the one shown in FIG. 6.

As the dose increases from zero, the thickness of the photoresist changes after development. For the purposes of this discussion, this curve is called the contrast curve. The contrast curve is used to select the dose which will determine the intermediate thickness for the second exposure. The intermediate thickness should have a dose to print within 125% and preferably 110% of a local minimum so that the second patterning cycle will only remove those thicknesses of photoresist at the bottom of the feature. Thus, there is a marked improvement of the sidewall angle.

Figure 4A:
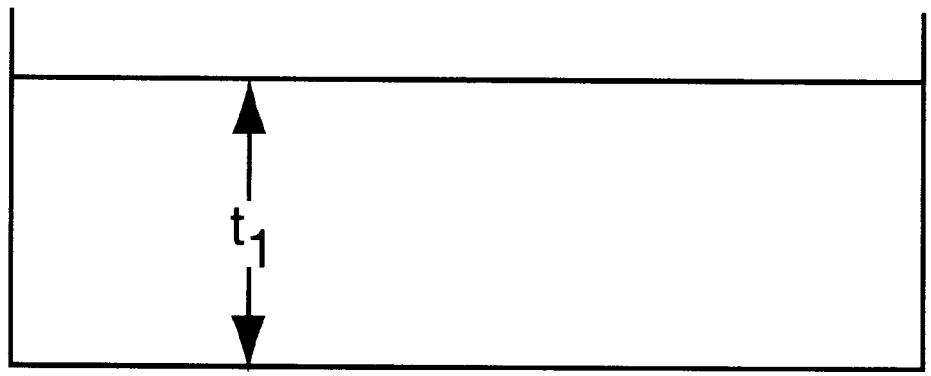
FIGS. 4a–c show the steps of the method of the present invention.
Figure 4B:
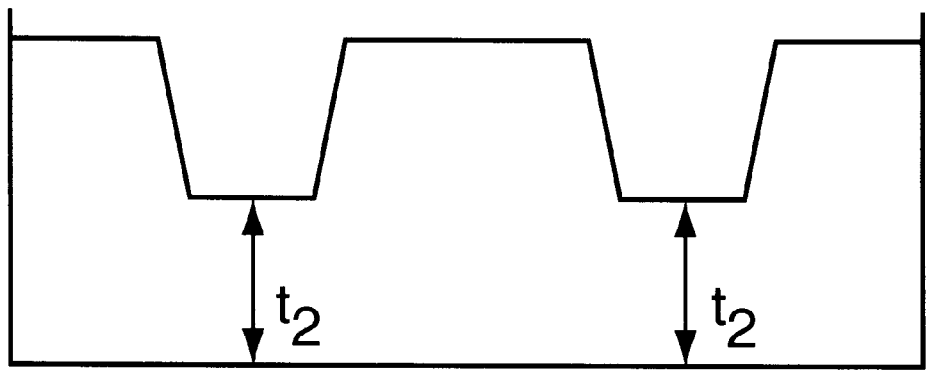
Figure 4C:
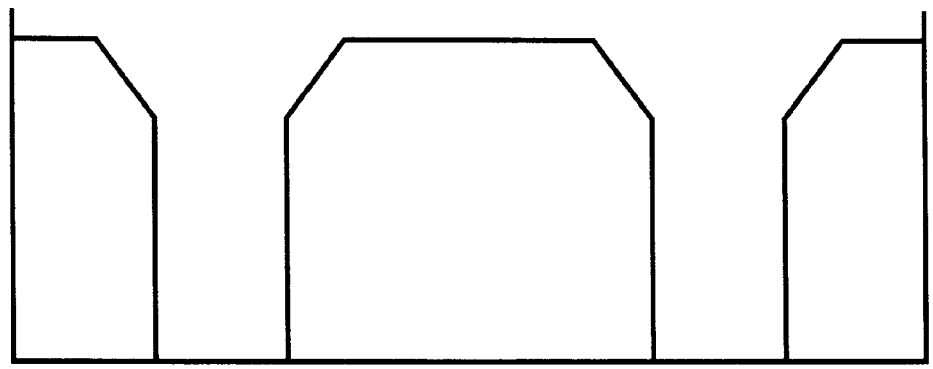
Figure 5A:
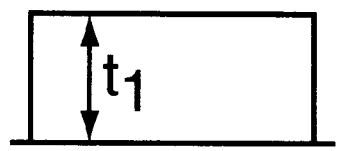
FIG. 5 is a cross section of the prior art method of forming features.
Figure 5B:
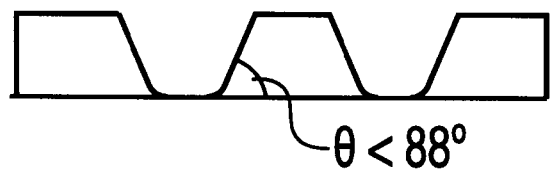

After the first patterning cycle, the pattern in the photoresist is only partially printed so that the remaining photoresist is at an intermediate value, $t_2$, shown in FIG. 4. The second exposure is chosen to correlate to the thickness $t_2$. Only the resist of thickness $t_2 \pm 10\%$ will be exposed and developed, leading to improved sidewall slopes at the bottom of the photoresist.

Figure 6:
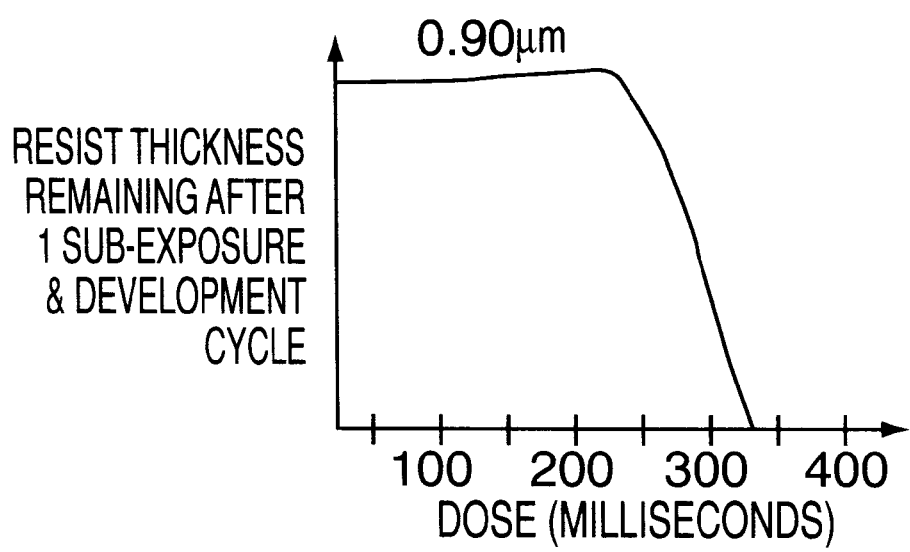
FIG. 6 is a representative of a photoresist's thickness as a function of dose curve.

Each individual resist has a unique contrast curve, depending on the chemical composition, post apply bake, post expose bake and develop. To determine the contrast curve for a given set of conditions, the resist is coated and initially measured using a optical spectroscope or ellipsometer. Then various doses from 0 dose to 800 mJ/cm$^2$ are used, with bake and develop, and resulting thickness of resists are again measured. The data is then plotted as shown in FIG. 6.

According to a method of the instant invention, a surface having a positive photoresist thereon would have at least two intervals of light exposure during one patterning cycle. A first interval of exposure to a predetermined intensity of light would be followed by an interval where the surface was baked at a predetermined temperature and developed, removing the resist to achieve an intermediate thickness which has a dose to print near a local minima. The surface would then be exposed to a predetermined intensity of light for subsequent intervals (n) which would be followed by a baking and developing interval for each subsequent exposure interval. According to this first method it is highly advantageous that the predetermined intensities for the first and subsequent exposures be selected such that the intensity during the first exposure be smaller than the intensity for subsequent exposure. It is most advantageous that the intensity of exposure for the (n–1) interval be smaller than the intensity of exposure for the (n) interval. However in alternate embodiments, the invention is still workable if the dose to print of the initial thickness is not smaller than the dose to print of the intermediate thickness. It is assumed that the entirety of the patterning desired will be completed in one patterning cycle.

For example purposes only, all of the examples will describe two intervals. An operator should select an initial thickness of photoresist using the plot given in FIG. 3. The operator should then select an intermediate thickness of photoresist, also using the plot given in FIG. 3. In order to achieve the intermediate thickness, the operator must expose, bake and develop the photoresist using a dose as indicated by the individual photoresist contrast curve. A discussion of the development of contrast curves and the use of the contrast curve in this context was given infra. For a first embodiment of the instant invention, the initial and intermediate thicknesses must be selected such that the intermediate thickness is thinner than the initial thickness. Additionally, in the first embodiment, the minimum light intensity necessary to print the intermediate thickness must be less than the minimum light intensity necessary to print the initial thickness. The required dose can be determined using crosssectional images or by any other means known in the art. In a preferred embodiment the initial thickness would have a corresponding dose of at least about 2% of a maxima and the intermediate thickness would have a corresponding dose of at most about 110% and at least about 100% of a minimum. Also in a preferred embodiment, the thicknesses and corresponding light intensities would be selected such that there are no other local maxima and minima between the maxima and minima selected as corresponding to the initial thickness and the intermediate thickness. In a more preferred embodiment, the total dose necessary to accomplish multiple exposures using the method of the instant invention would be substantially the same dose necessary to accomplish a single exposure where a thickness similar to the initial thickness was substantially printed. It is advantageous to have the dose of the initial thickness be higher than the dose of the intermediate thickness. It is advantageous since when the dose of the initial thickness is higher, there is less concern that a subthreshold light intensity will print the photoresist.

According to the method of the instant invention, for one embodiment, the general steps are as follows:

1) apply an initial thickness of photoresist such that the criteria above is met, it should be noted that the application step may in itself involve a bake step;
2) expose the photoresist using a first mask, for a period of time, such that the initial thickness is reduced to an intermediate thickness such that the criteria above is met;
3) bake the photoresist for a predetermined period of time such that substantially all of the chemical reaction that will occur does occur. The baking would preferably persist for a period of time such that substantially all of the photoacid and/or photoacid generator affected during the exposure step will diffuse the standing waves in the photoresist. The photoacid present may be the by-product created during the exposure step.
4) remove the photoresist in the exposed areas
5) expose the photoresist using a second mask, for a period of time, such that the intermediate thickness is substantially printed, the second mask preferably being the same mask as the first mask;
6) bake the photoresist for a predetermined period of time such that substantially all of the chemical reaction that will occur does occur. Again, the baking would preferably persist for a period of time such that substantially all of the photoacid and/or photoacid generator affected during the exposure step will diffuse the standing waves in the photoresist.

The photoacid present may be the by-product created during the exposure step.

7) remove the remaining exposed areas of photoresist.

For each of the steps given above, there are a set of optimal parameters which are given herein, by step.—

Coating: Any photoresist maybe used, for example, a diazoquinone napthalene (DNQ) or a chemically amplified resist. We have used TOK 3600 photoresist (which is a DNQ type photoresist) manufactured by Ohka America. The spin speed of the wafer during coating ranges from 1000–8000 rpm, to adjust the resist thickness as desired. Our spin speed was ≈4177 rpm for a thickness of 0.95 um. The thickness of the photoresist is greater than the desired thickness after the double develop process, as described in our method. When, as stated earlier the photoresist application process involves a bake the post apply bake parameters are:

Temperatures range from 70–150° C., and we preferably use a 110° C. post apply bake. The time of the bake is from 30–120 seconds and we use a bake time of 5 seconds for exhaust bake followed by 60 seconds under vacuum. This method doesn't depend on the type of bake (i.e. vacuum bake, exhaust bake, nitrogen, forming gas bake) and any combination of bakes may be used.

Exposure conditions: For both exposures, any numerical aperture (NA) may be used for example and NA of 0.1 to 1.0 and preferably we use a NA of 0.5. Also any partial coherence of the illumination may be used for example from at least about 0.0 to at most about 1.0, we preferably use a partial coherence of 0.7. The first and second exposures do not have to be at the same NA and partial coherence condition, and change the second exposure to a higher NA may provide additional improvement of the sidewalls. The focus condition may range from −10 um to +10 um (the sign indicates the directionality of the wafer position relative to the lens), and preferably is −0.2 um. The second exposure does not have to be at the same focus condition as the first exposure, and there may be additional improvement in the resist sidewall slope due to changing the focus on the second exposure step. Wavelength can be any optical wavelength (from x-ray at 1 nm to 1000 nm). We preferably used 365 nm. The exposure step could be performed as one "operation" and the post exposure bake below be considered part of the exposure step.

Post expose bake: both bakes are performed similar to the post apply bake. The two bakes do not have to be performed for the same time and temperature, although that is how we carried through our experiments. The post expose bake ranges from 70–150° C. and is preferably run at 110° C. The typical bake time ranges from 30–120 seconds under a variety of conditions (nitrogen, vacuum, exhaust bake, forming gas). These bakes can be employed in combinations. We preferably employ a 5 second exhaust bake immediately followed by a 60 second vacuum bake. The post expose bake time and temperature are chosen to be sufficient to drive acid diffusion in the desired area. Preferably, there would be a cooling after the bake such that uniform chemical reaction to radiation was achieved. The cooling temperature range would preferably be about 19–25° C.

Develop steps: both develop steps were performed identically, although it is possible to achieve similar results with two different kinds of develop recipe for the 2 separate develop steps. The photoresist is usually exposed to developer for at least about 15 and at most about 300 seconds depending on the resist thickness and the process, with any combination of single or multiple puddle steps of developer. The developer step may be preceded by a deionized water or developer pre-wet stage, and followed by a developer or de-ionized water rinse and dry. We preferably use a de-ionized water prewet followed by one developer puddle of 60 seconds followed by a second developer puddle of 20 seconds, followed by a developer rinse and then a de-ionized water rinse and dry. The exposed photoresist was removed using a solution typically used to remove the specific type of photoresist. In our case, TMAH, tetramethylammonium hydroxide, of 0.263 normality was used.

As an example, when the initial thickness is 0.95 $\mu$m and the intermediate thickness is 0.90 $\mu$m, the first dose was 50 milliseconds and the second dose was 300 milliseconds. An outline of the example is given below. All exposures were carried out at 365 nm and were used to print 0.325 $\mu$m lines and spaces.

A layer of photoresist approximately 0.95 $\mu$m is applied to a substrate. The photoresist is applied according to any means known in the art. One way of applying the photoresist is by spinning it on the substrate, preferably at spin speeds of at least about 1500 rpm and at most about 4500 rpm. The photoresist coated substrate is then preferably prebaked at a temperature of about 80–130° C. for about 30–90 seconds and then cooled to a temperature of 19–25° C. A first mask is introduced and the photoresist covered substrate is then illuminated a first time for 50 milliseconds. Then the photoresist coated substrate would be baked for a period of time sufficient to drive acid generation/diffusion. Preferably, the photoresist coated substrate would be baked for 30–90 seconds at 80–130° C. Preferably, the photoresist coated substrate would then be cooled. A base solution of TMAH would then be applied to remove the exposed photoreist. The photoresist coated substrate would then be exposed for a second time, using a second mask, for 300 milliseconds. The photoresist coated substrate would then be baked again, preferably cooled again and TMAH would again be applied. Preferably, as a final step, the photoresist coated substrate would be baked again to drive off excess water at 90–190° C. for 30–90 seconds.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method of making at least one feature on an object having an upper surface, comprising the steps of:
    a) applying a layer of a photoresist having an initial thickness to the upper surface;
    b) exposing the layer of photoresist to a first dosage of light having a first intensity for a first predetermined period of time, such that at least a portion of the upper surface has a first thickness that is at most equal to the initial thickness, the first dose being a local maxima; and
    c) developing the exposed photoresist;
    d) exposing the layer of photoresist to a second dosage of light having a second intensity for a second predetermined period of time, such that at least a subset of the portion of the upper surface exposed by the first dosage of light is exposed by the second dosage of light, the first dose less than the second dose, wherein the predetermined second dose of light is required to effectively expose the photoresist at the first thickness and the first dose is sufficient to reduce the initial thickness to the first thickness, the first thickness being capable of being substantially completely developed by the predetermined second dose of light;
    e) developing the exposed photoresist.

2. The method according to claim 1 wherein a predetermined maximum dose of light is required to effectively expose the photoresist at the initial thickness and the first dose is at least about 2% of the maximum dose for the initial thickness.

3. The method according to claim 2 wherein the first dose is about 15% of the maximum dose needed to expose the initial thickness.

4. The method according to claim 3 wherein the second dose is at most about 110% of the minimum dose necessary to reduce the initial thickness to the first thickness.

5. The method according to claim 2 wherein the second dose is at most about 125% of the minimum dose necessary to reduce the initial thickness to the first thickness.

6. The method according to claim 1 wherein the second dose is at most about 125% of the minimum dose necessary to reduce the initial thickness to the first thickness.

7. The method according to claim 1 wherein the second dose is a local minima.

8. The method according to claim 1 further comprising placing a first mask over the object prior to the step of exposing the object to a first dosage of light.

9. The method according to claim 8 further comprising placing a second mask over the object prior to the step of exposing the object to a second dosage of light.

10. The method according to claim 9 wherein the second mask is substantially the same as the first mask.

11. The method according to claim 1 further comprising placing a first mask over the object prior to the step of exposing the object to a first dosage of light and placing a second mask over the object prior to the step of exposing the object to a second dosage of light.

12. The method according to claim 11 wherein the second mask is substantially the same as the first mask.

13. The method according to claim 1 wherein the object is a semiconductor wafer.

14. The method according to claim 13 wherein the semiconductor wafer comprises silicon.

* * * * *